United States Patent
Lin

(10) Patent No.: US 10,935,182 B2
(45) Date of Patent: Mar. 2, 2021

(54) MOBILE DEVICE AND COMPUTER DEVICE STAND

(71) Applicant: SOLUTION EXPERT 33 INTERNATIONAL CO., LTD., Tortola (VG)

(72) Inventor: Ben-Tien Lin, New Taipei (TW)

(73) Assignee: Solution Expert 33 International Co., Ltd., Tortola (VG)

(*) Notice: Subject to any disclaimer, the term of this patent is extended or adjusted under 35 U.S.C. 154(b) by 71 days.

(21) Appl. No.: 16/261,602

(22) Filed: Jan. 30, 2019

(65) Prior Publication Data

US 2020/0208773 A1  Jul. 2, 2020

(30) Foreign Application Priority Data

Dec. 27, 2018 (CN) .......................... 201822224087.7

(51) Int. Cl.
| | |
|---|---|
| *B65D 5/52* | (2006.01) |
| *A47B 23/04* | (2006.01) |
| *F16M 13/00* | (2006.01) |
| *H05K 5/02* | (2006.01) |
| *F16B 1/00* | (2006.01) |

(52) U.S. Cl.
CPC ............ *F16M 13/005* (2013.01); *F16B 1/00* (2013.01); *H05K 5/0234* (2013.01); *A47B 23/043* (2013.01); *A47B 23/044* (2013.01); *B65D 5/52* (2013.01); *B65D 5/5206* (2013.01); *F16B 2001/0035* (2013.01)

(58) Field of Classification Search
USPC .............. 248/459, 460, 461, 463, 454, 455; 206/45.24, 468
See application file for complete search history.

(56) References Cited

U.S. PATENT DOCUMENTS

| | | | | | |
|---|---|---|---|---|---|
| 2,262,240 | A | * | 11/1941 | Koeble | G09F 1/06 40/124.18 |
| 2,726,835 | A | * | 12/1955 | Hummel | A47F 5/112 248/459 |
| 4,460,146 | A | * | 7/1984 | Raggiotti | A47G 1/24 248/456 |
| 4,579,232 | A | * | 4/1986 | Fedak | A47F 5/112 206/45.25 |
| 4,918,848 | A | * | 4/1990 | Stein | G09F 7/00 40/124.2 |
| 5,083,663 | A | * | 1/1992 | Conway | B65D 5/5206 206/45.26 |
| 8,132,670 | B1 | * | 3/2012 | Chen | A45C 11/00 206/320 |

(Continued)

*Primary Examiner* — Alfred J Wujciak
(74) *Attorney, Agent, or Firm* — Rosenberg, Klein & Lee

(57) ABSTRACT

A mobile device and computer device stand used for a mobile device/computer device includes a second platy body, a first platy body, and a support piece. One end of the first platy body is connected to one end of the second platy body. The middle portion of the first platy body is formed with a hole. A support portion is disposed on the first platy body. The support portion is located at one end of the first platy body opposite to the end connected to the second platy body. The support piece is disposed in the hole. The support piece has a fold line. The support piece is divided into a first portion and a second portion by the fold line. The second portion is connected to the support portion.

11 Claims, 13 Drawing Sheets

(56) References Cited

U.S. PATENT DOCUMENTS

| | | | | |
|---|---|---|---|---|
| 8,162,283 B1* | 4/2012 | Royz | ............... | F16M 11/10 |
| | | | | 248/455 |
| 8,424,829 B2* | 4/2013 | Lu | ............... | A45C 7/0036 |
| | | | | 248/152 |
| 8,919,544 B2* | 12/2014 | Lee | ............... | A45C 11/00 |
| | | | | 206/320 |
| 8,950,720 B1* | 2/2015 | Carr | ............... | A47B 23/044 |
| | | | | 248/454 |
| 8,960,630 B2* | 2/2015 | Fu | ............... | F16M 11/10 |
| | | | | 248/371 |
| 8,985,543 B2* | 3/2015 | Chen | ............... | A45C 11/00 |
| | | | | 206/45.24 |
| 9,717,314 B2* | 8/2017 | Idehara | ............... | A45C 11/00 |
| 10,302,243 B1* | 5/2019 | Scholz | ............... | F16M 11/041 |
| 2003/0019996 A1* | 1/2003 | Shields | ............... | F16M 11/38 |
| | | | | 248/454 |
| 2003/0213886 A1* | 11/2003 | Gilbert | ............... | A45F 5/00 |
| | | | | 248/454 |
| 2004/0245413 A1* | 12/2004 | Dempsey | ............... | A47F 5/112 |
| | | | | 248/150 |

* cited by examiner

MOBILE DEVICE AND COMPUTER DEVICE STAND

CROSS-REFERENCE TO RELATED APPLICATIONS

This non-provisional application claims priority under 35 U.S.C. § 119(a) on Patent Application No(s). 201822224087.7 filed in China, P.R.C. on Dec. 27, 2018, the entire contents of which are hereby incorporated by reference.

FIELD OF THE INVENTION

The present invention relates to a support device, and more particularly to a mobile device and computer device stand for a mobile device and computer device. The mobile device and computer device stand can be operated with ease.

BACKGROUND OF THE INVENTION

Hand-held mobile devices and computer devices, such as mobile phones, tablet computers and the like, bring great convenience. These devices become indispensable for our daily life. However, if it is necessary to use a mobile device or computer device to watch TV or videos for a long time, the user needs to hold the mobile device or computer device all the time, which is inconvenient for use. There are mobile device and computer device protective cases that can be folded into stands. But, the size of the protective case is greater than that of the mobile device and computer device. It is not easy to operate and is inconvenient for use.

Accordingly, the inventor of the present invention has devoted himself based on his many years of practical experiences to solve these problems.

SUMMARY OF THE INVENTION

The primary object of the present invention is to provide a mobile device and computer device stand for a mobile device and computer device to stand on a plane. The mobile device and computer device stand is small in size and is easy to operate.

In order to achieve the above object, the present invention discloses a mobile device and computer device stand used for a mobile device/computer device. The mobile device and computer device stand comprises a second platy body, a first platy body, and a support piece. One side of the second platy body is connected to the back of the mobile device and computer device. One end of one side of the first platy body is connected to one end of another side of the second platy body. The first platy body is bendable relative to the second platy body. The middle portion of the first platy body is formed with a hole. A support portion is disposed on the first platy body. The support portion is located at one end of the first platy body opposite to the end connected to the second platy body. The support piece is disposed in the hole. The support piece has a fold line. The support piece is divided into a first portion and a second portion by the fold line. The second portion is connected to the support portion, so that the support piece is bendable relative to the first platy body.

In some embodiments, when the first platy body and the support piece are in a bent state, the first portion passes through the hole to form an intersecting state with the first platy body. When the second portion and the support portion are placed on a plane, the mobile device and computer device stands on the plane in an inclined manner.

In some embodiments, when the first platy body and the support piece are in a bent state, the first portion passes through the hole to form an intersecting state with the first platy body, and the support portion leans against the first platy body. When the fold line of the support piece is placed against a plane, the mobile device and computer device stands on the plane in an inclined manner.

In the above embodiments, preferably, a magnetic member is provided in each of the support portion and the second platy body, so that the support portion can be attached to the second platy body when no support is needed.

Besides, the present invention discloses another mobile device and computer device stand. The size of this mobile device and computer device stand is about the size of a general tablet computer. The mobile device and computer device stand is attached to the back of a large mobile device and computer device for supporting the large mobile device on a plane.

In some embodiments, the support piece has a first fold line and a second fold line. The support piece is divided into a first portion, a second portion and a third portion by the first fold line and the second fold line. The third portion is connected to the support portion. In use, this embodiment has two bent modes. In a first bent mode, when the first platy body and the support piece are in a bent state, the first portion, the second portion or the third portion passes through the hole to form at least one intersecting state with the first platy body. When the third portion and the support portion are placed on a plane, the mobile device and computer device stands on the plane in an inclined manner. In a second bent mode, when the first platy body and the support piece are in a bent state, the second fold line leans against the support portion so that the mobile device and computer device stands on the plane in an inclined manner.

Preferably, the first platy body and the second platy body are made of a flexible material.

Preferably, the support piece is integrally formed with the first platy body.

In this way, by folding the second platy body, the first platy body and the support piece into a structure that can support the mobile device and computer device, the mobile device and computer device can stand on a plane such as a desktop, so that there is no need for the user to hold the mobile device and computer device all the time. Moreover, through the second platy body and the first platy body small in size and disposed at the back of the mobile device and computer device, it is easy and convenient to control the operation for folding the stand.

DETAILED DESCRIPTION OF THE PREFERRED EMBODIMENTS

Embodiments of the present invention will now be described, by way of example only, with reference to the accompanying drawings.

Figure 1:
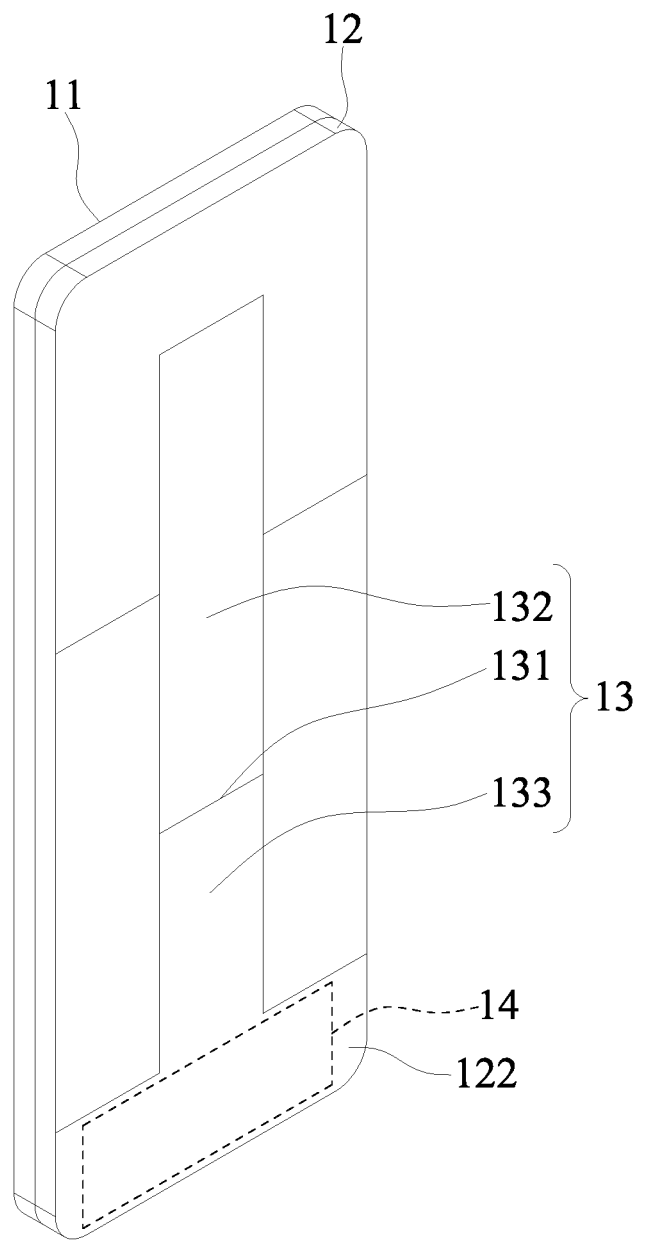
FIG. 1 is a perspective view of a first embodiment of the present invention.

FIG. 1 is a perspective view of a first embodiment of the present invention. FIGS. 2A-2D are schematic views of the first embodiment of the present invention when in use. As shown in the figures, the present invention discloses a mobile device and computer device stand 1 used for a mobile device/computer device 2. The mobile device and computer device stand 1 comprises a second platy body 11, a first platy body 12, and a support piece 13. One side of the second platy body 11 is connected to the back of the mobile device and computer device 2. One end of one side of the first platy body 12 is connected to one end of another side of the second platy body 11. The first platy body 12 is bendable relative to the second platy body 11. The middle portion of the first platy body 12A is formed with a hole 121. A support portion 122 is disposed on the first platy body 12. The support portion 122 is located at one end of the first platy body 12 opposite to the end connected to the second platy body 11. The support piece 13 is disposed in the hole 121. The support piece 13 has a fold line 131. The support piece 13 is divided into a first portion 132 and a second portion 133 by the fold line 131. The second portion 133 is connected to the support portion 122, so that the support piece 13 is bendable relative to the first platy body 12.

Figure 2A:
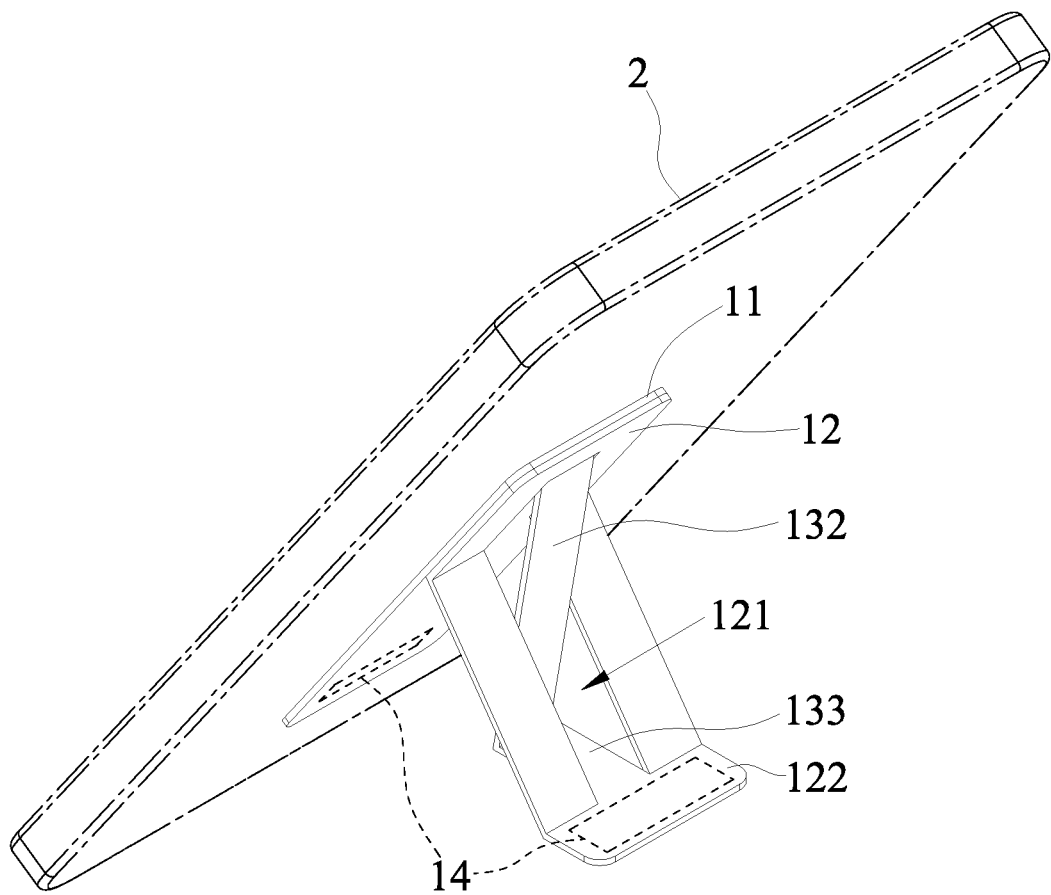
FIG. 2A is a first schematic view of the first embodiment of the present invention when in use.

FIG. 2A shows an implementation of this embodiment. In use, the user controls the first platy body 12 and the support piece 13 to be in a bent state. The first portion 132 passes through the hole 121 to form an intersecting state with the first platy body 12 (please refer to FIG. 2B), and then the second portion 133 and the support portion 122 are placed on a plane. At this time, the mobile device and computer device 2 stands on the plane in an inclined manner. Moreover, as shown in FIG. 2, the length of the first portion 132 is greater than that of the second portion 133, so that the angle of inclination of the mobile device and computer device 2 when placed on the plane is relatively greater for the user to touch the mobile device and computer device 2 easily.

Figure 2B:
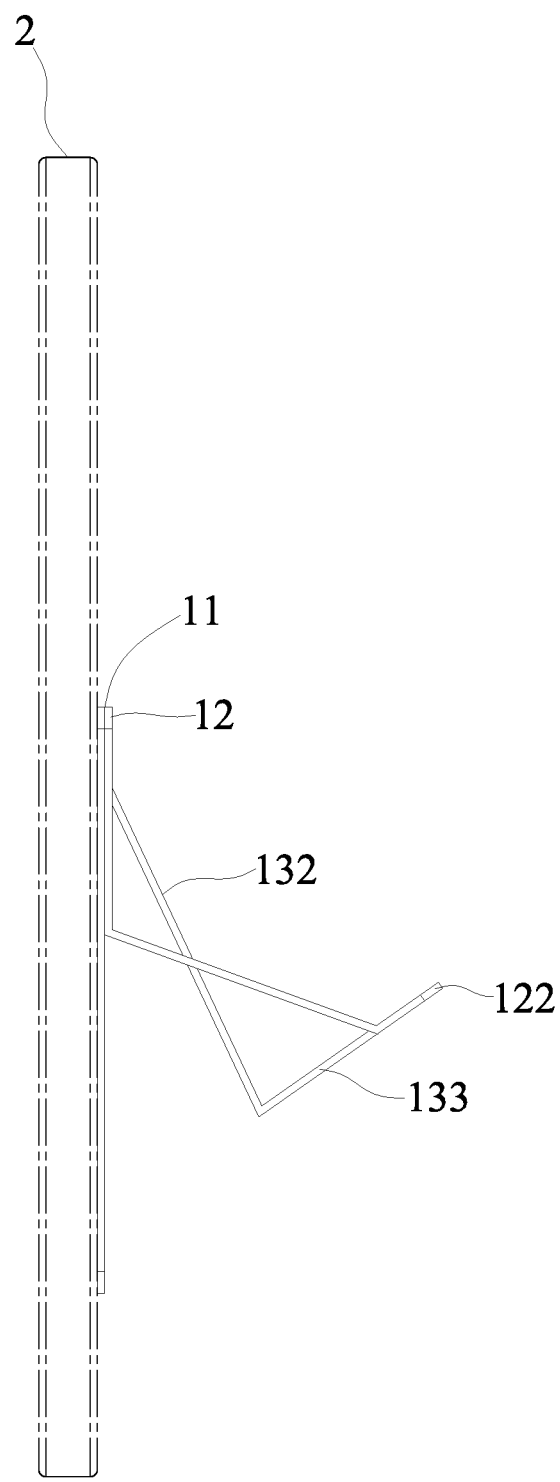
FIG. 2B is a second schematic view of the first embodiment of the present invention when in use.
Figure 2C:
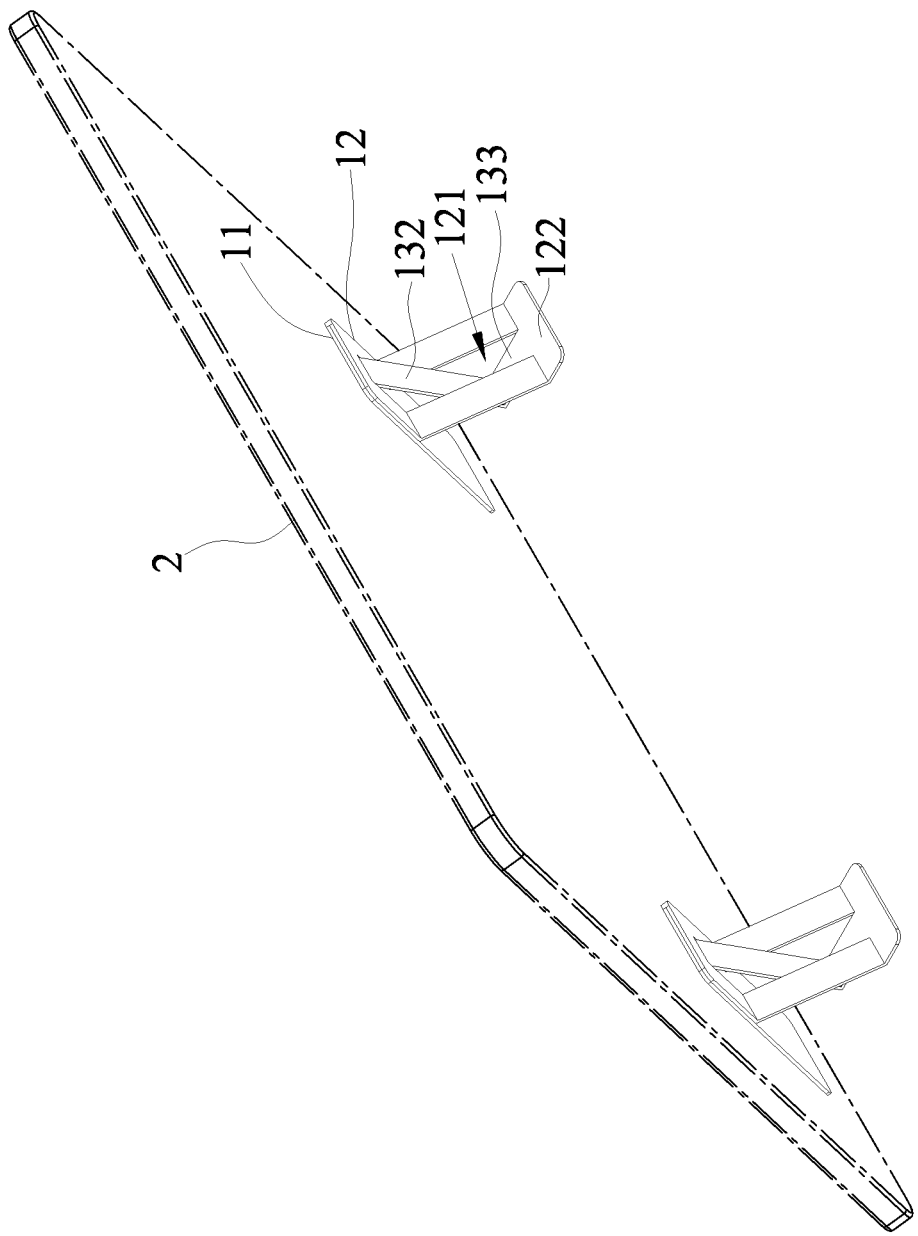
FIG. 2C is a third schematic view of the first embodiment of the present invention when in use.
Figure 2D:
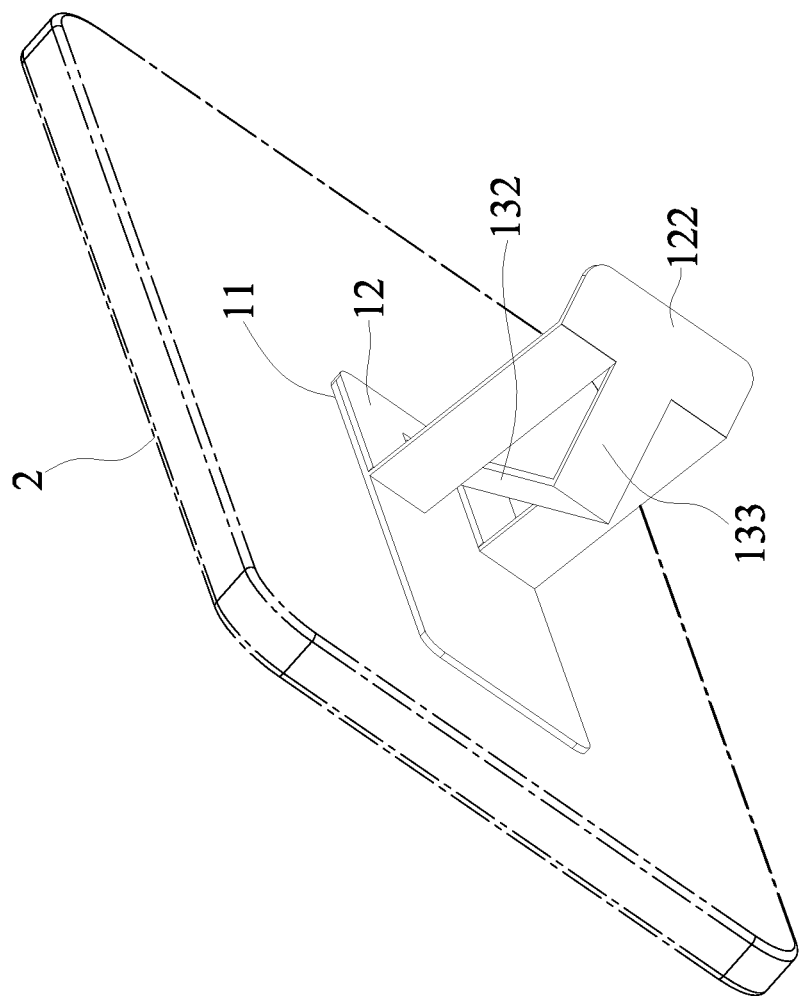
FIG. 2D is a fourth schematic view of the first embodiment of the present invention when in use.

The first platy body 12 is made of a flexible material, such as plastic, elastic metal sheet, leather, and the like. In this embodiment, the material of the second platy body 11 and the first platy body 12 is leather. The support piece 13 is integrally formed with the first platy body 12. In this way, the second platy body 11 and the first platy body 12 have a certain deformation, and the integral feature enables the user to operate the first platy body 12 and the support piece 13 easily. Moreover, a magnetic member 14 is provided in each of the support portion 122 and the second platy body 11. Through the magnetic members 14, the first platy body 12 can be closely attached to the second platy body 11 when there is no need to support the mobile device and computer device 2. The first platy body 12 and the support piece 13 will not be separate from each other randomly to be in a bent state, thereby improving the practicality of the invention. As shown in FIG. 2B, the user may install a plurality of mobile device and computer device stands 1 on the mobile device and computer device 2 to increase the stability of the mobile device and computer device 2.

Figure 3A:
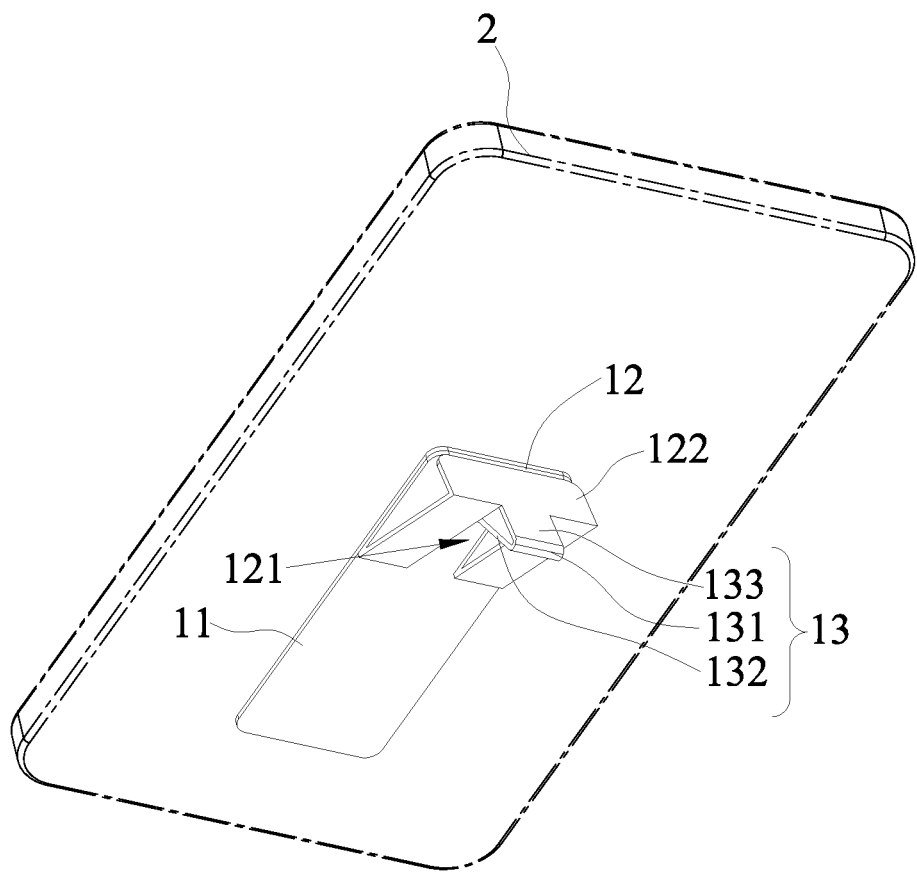
FIG. 3A is a first schematic view of another implementation of the first embodiment of the present invention when in use.
Figure 3B:
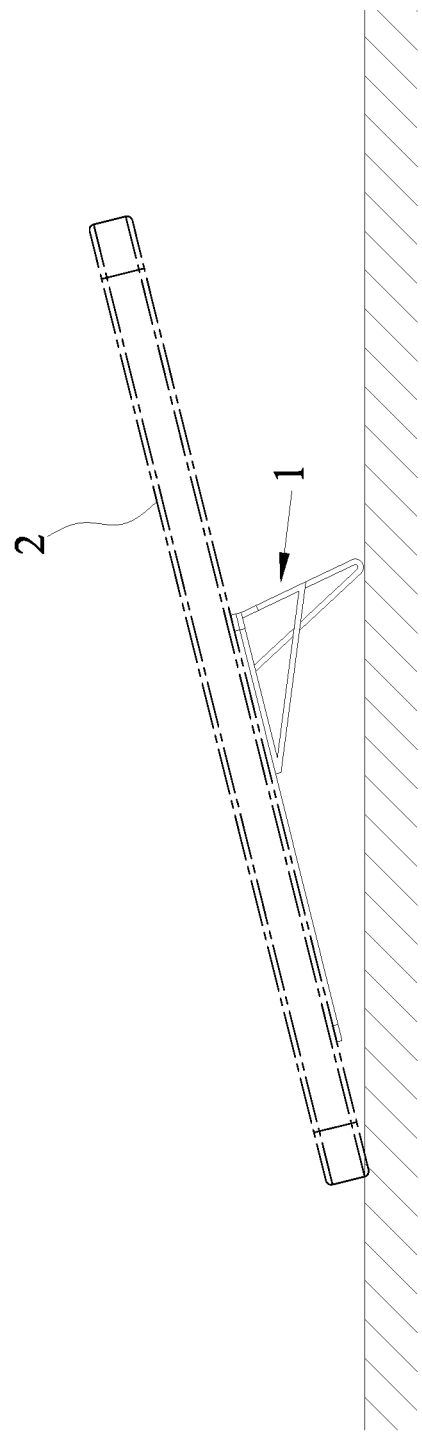
FIG. 3B is a second schematic view of another implementation of the first embodiment of the present invention when in use.

FIG. 3A and FIG. 3B are schematic views of another implementation of the first embodiment of the present invention when in use. As shown in the figures, this implementation provides another support mode compared to the above implementation. In use, the user controls the first platy body 12 and the support piece 13 to be in a bent state. The first portion 132 passes through the hole 121 to form an intersecting state with the first platy body 12, and then the support portion 122 leans against the first platy body 12. Finally, the fold line 131 of the support piece 13 is placed against a plane, and the mobile device and computer device 2 stands on the plane in an inclined manner.

It can be seen from FIG. 2A and FIG. 3B that the mobile device and computer device 2 is placed on the plane in an inclined manner, allowing the mobile device and computer device 2 to have different angles of inclination. Through the same structure but in different bent modes, the user can choose the angle of inclination of the mobile device and computer device 2 to further enhance the diversity and practicality of the invention.

Figure 4A:
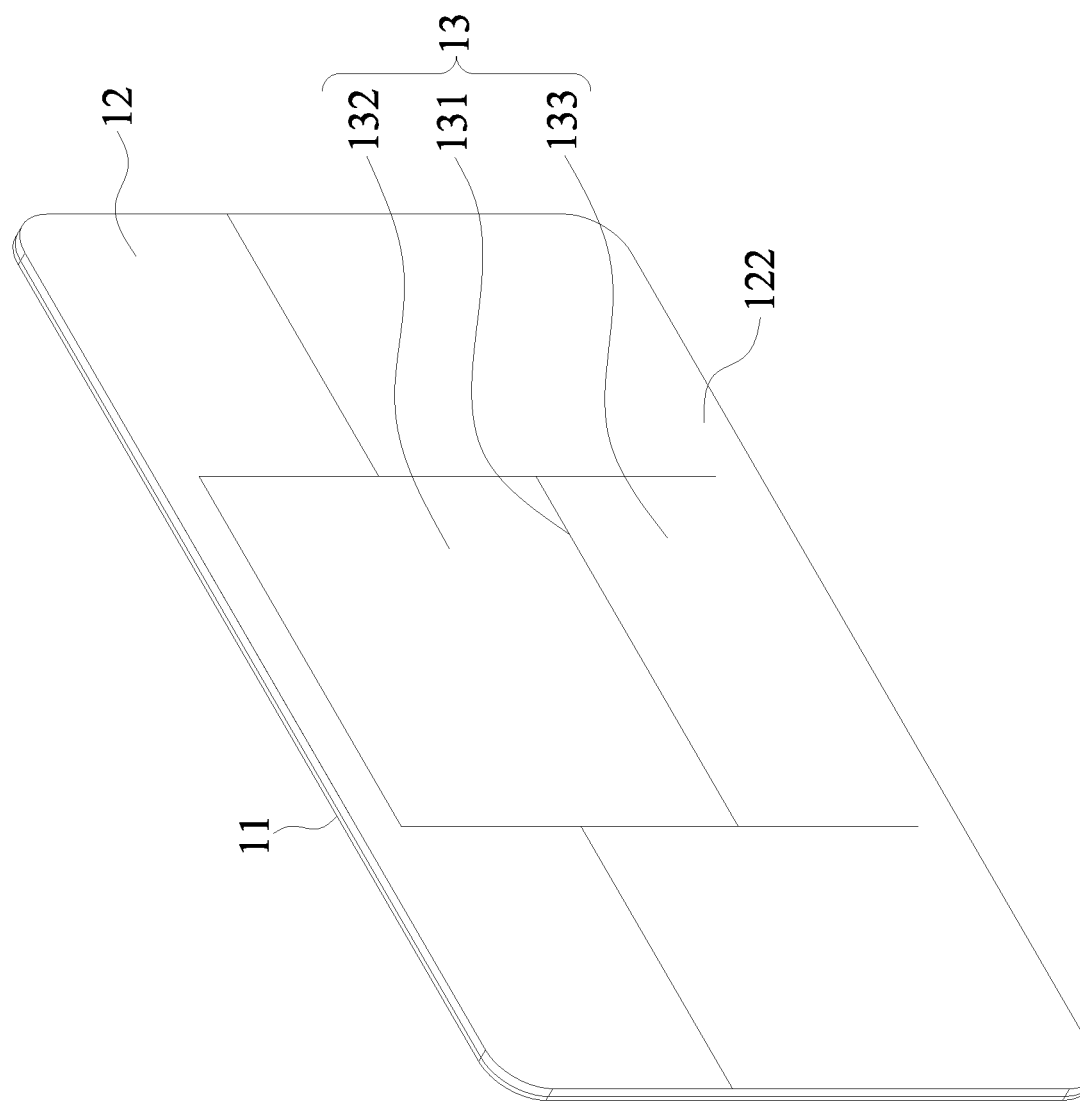
FIG. 4A is a third schematic view of another implementation of the first embodiment of the present invention when in use.
Figure 4B:
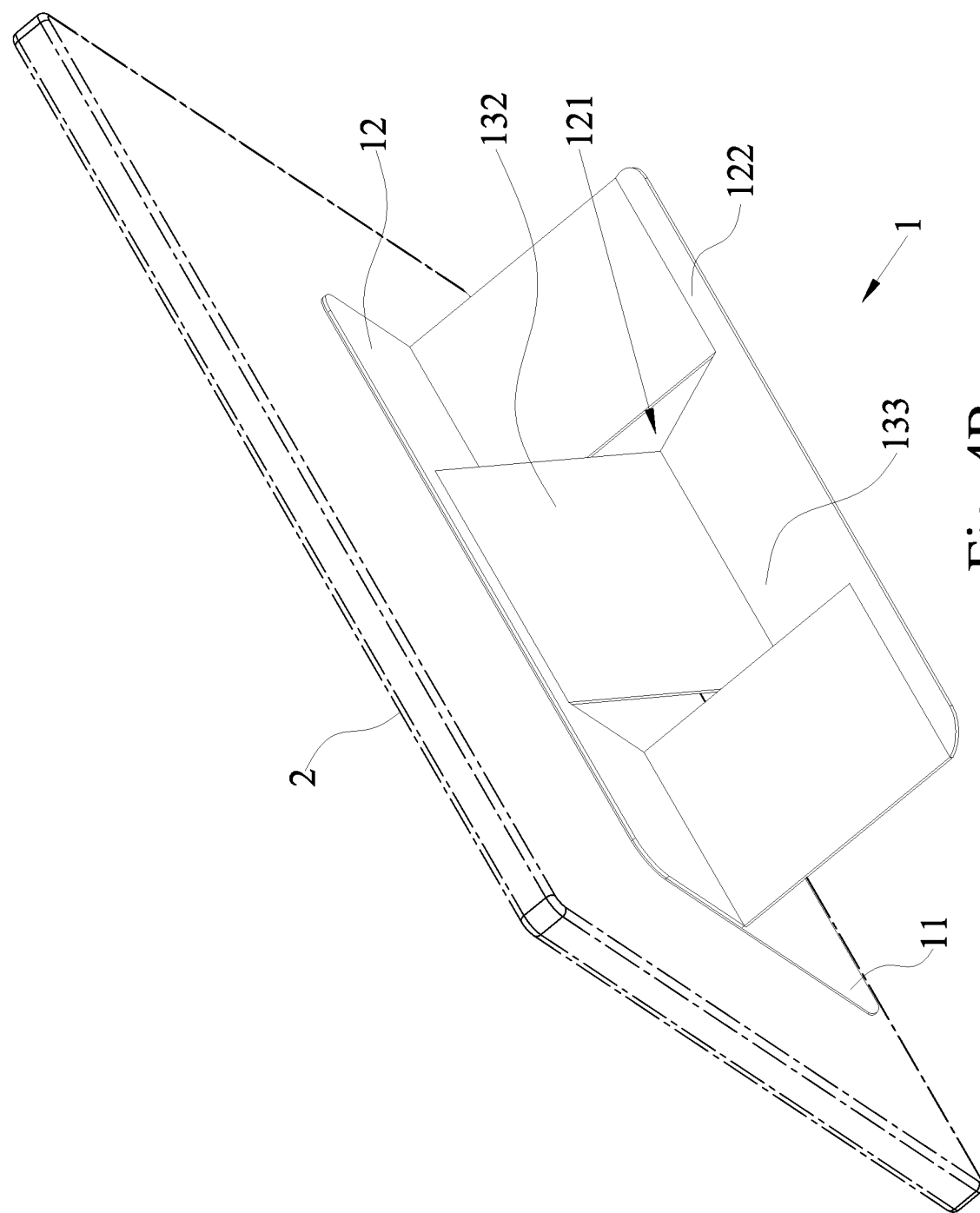
FIG. 4B is a fourth schematic view of another implementation of the first embodiment of the present invention when in use.

FIG. 4A is a perspective view of another implementation of the first embodiment of the present invention. FIG. 4B is a schematic view of another implementation of the first embodiment of the present invention when in use. As shown in the figures, the size of the mobile device and computer device stand is about the size of a general tablet computer. The mobile device and computer device stand is attached to the back of a large mobile device and computer device for supporting the large mobile device on a plane.

Figure 5A:
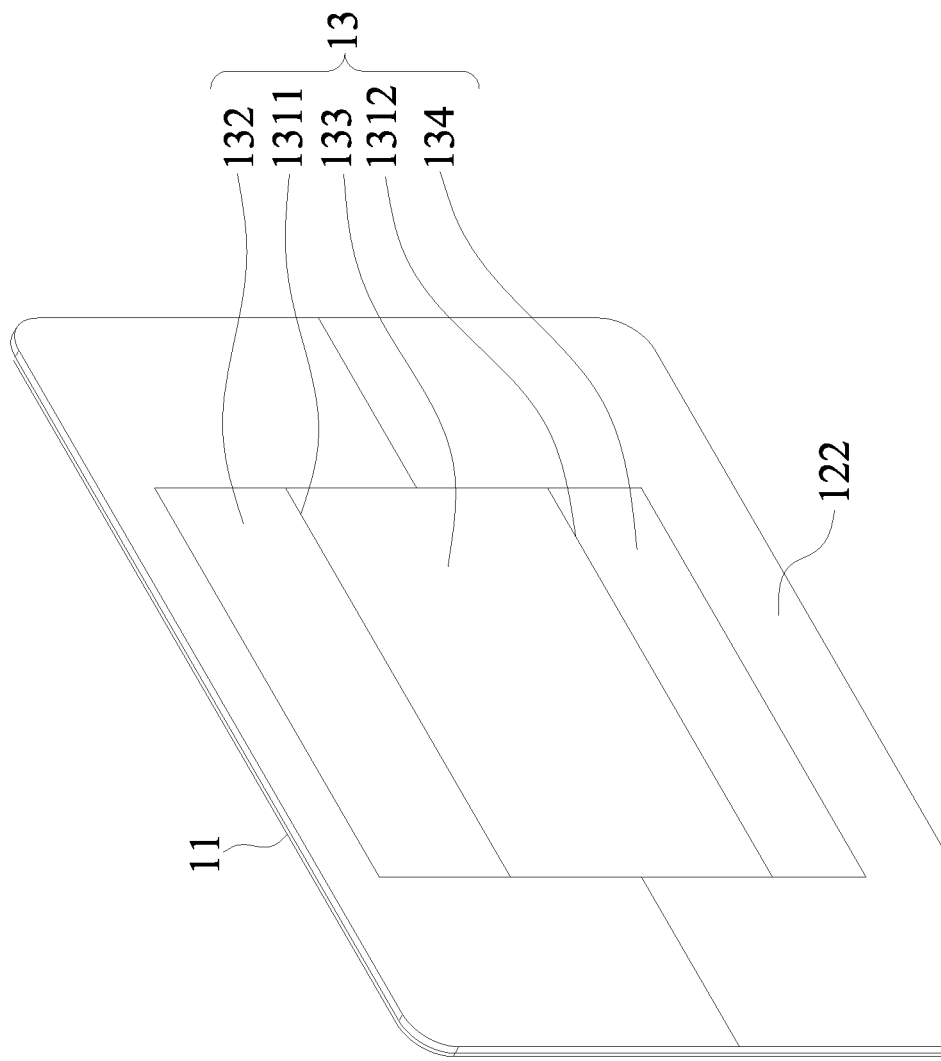
FIG. 5A is a perspective view of a second embodiment of the present invention.
Figure 5B:
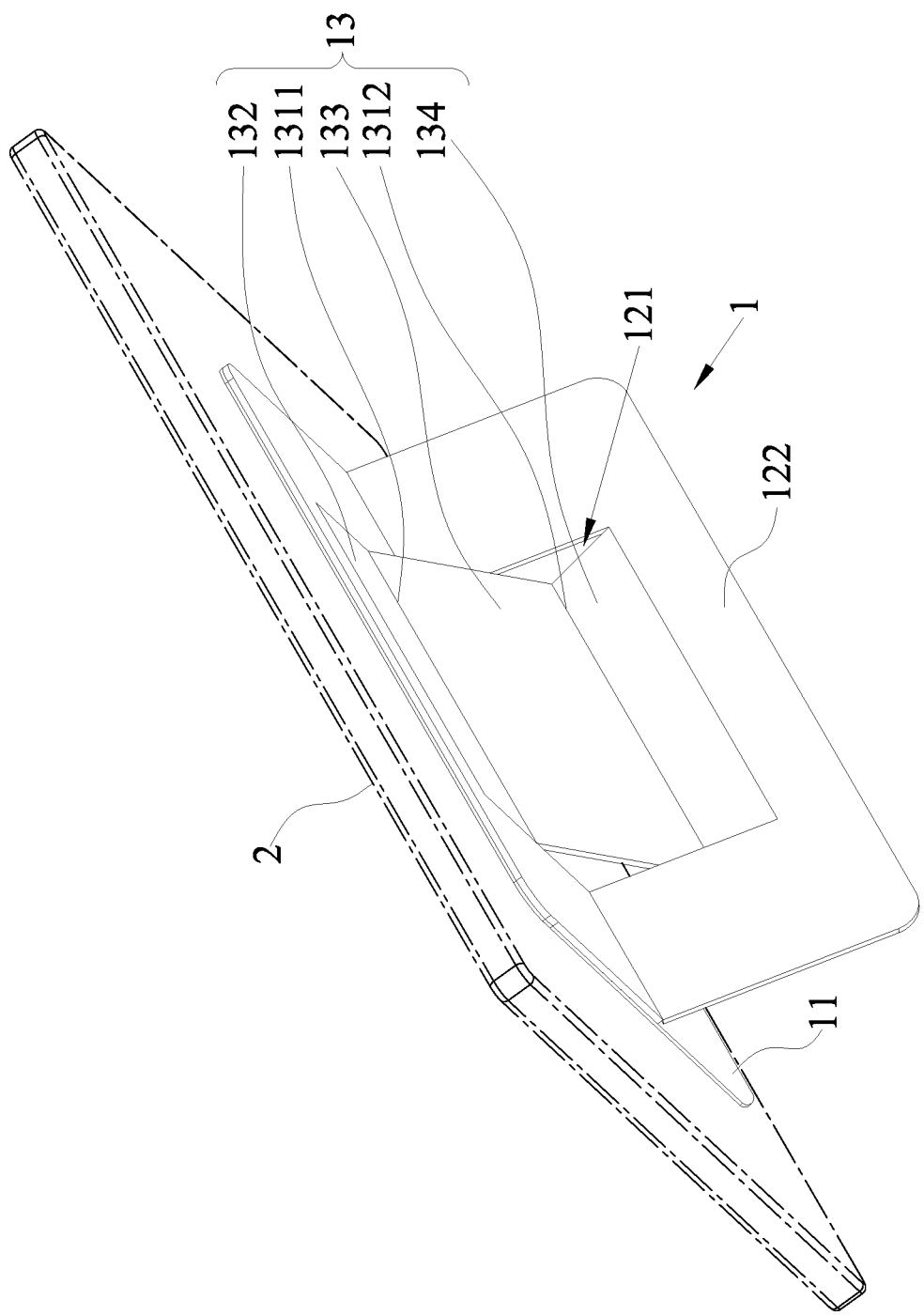
FIG. 5B is a schematic view of the second embodiment of the present invention when in use.
Figure 5C:
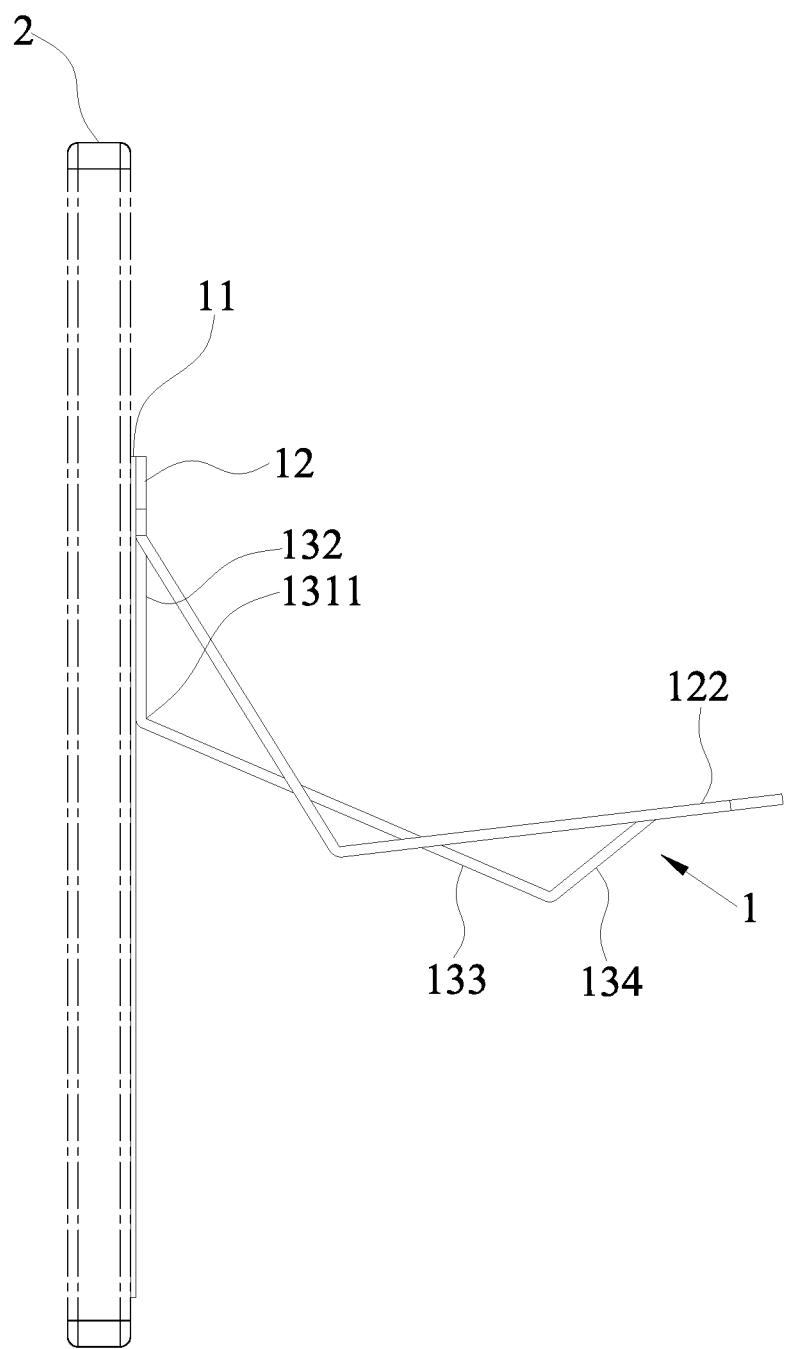
FIG. 5C is another schematic view of the second embodiment of the present invention when in use.
Figure 5D:
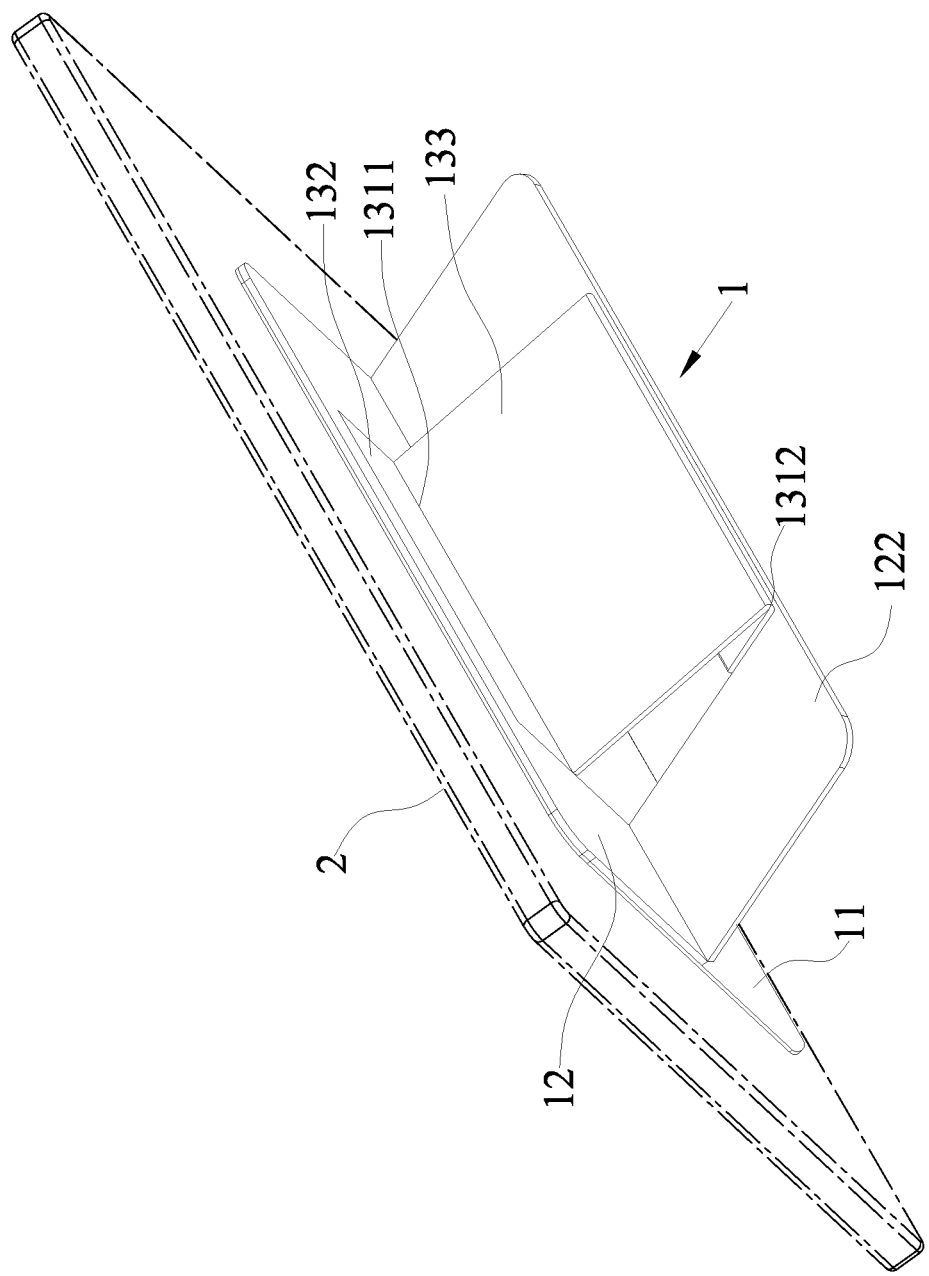
FIG. 5D is a schematic view of another implementation of the second embodiment of the present invention when in use.

FIG. 5A is a perspective view of a second embodiment of the present invention. FIGS. 5B-5D are schematic views of the second embodiment of the present invention when in use. As shown in the figures, in this embodiment, the support piece 13 has a first fold line 1311 and a second fold line 1312. The support piece 13 is divided into a first portion 132, a second portion 133 and a third portion 134 by the first fold line 1311 and the second fold line 1312. The third portion 134 is connected to the support portion 122. In use, the embodiment has two bent modes. FIG. 5B and FIG. 5C illustrate a first bent mode of the embodiment. As shown in FIG. 5B, when the first platy body 12 and the support piece 13 are in a bent state, the first portion 132, the second portion 133 or the third portion 134 passes through the hole 121 to form at least one intersecting state with the first platy body 12 (as shown in FIG. 5C). When the third portion 134 and the support portion 122 are placed on a plane, the mobile device and computer device 2 stands on the plane in an inclined manner. FIG. 5D illustrates a second bent mode of the embodiment. As shown in FIG. 5D, when the first platy body 12 and the support piece 13 are in a bent state, the second fold line 1312 leans against the support portion 122 so that the mobile device and computer device 2 stands on a plane in an inclined manner.

In summary, through the relative arrangement of the second platy body 11, the first platy body 12 and the support piece 13 of the present invention, the mobile device and computer device 2 can stand on a plane, which is convenient for use. Moreover, the mobile device and computer device stand 1 is small in size, and the operability of the structural deformation is improved, so that the user can use the mobile device and computer device stand 1 more conveniently, further increasing the convenience of use.

It is worth mentioning that the second platy body 11 of the invention is not an indispensable technical feature. In some embodiments, the mobile device and computer device stand 1 of the present invention comprises a first platy body and a support piece. The middle portion of the first platy body is formed with a hole. A support portion is disposed on the first platy body. The support portion is located at one end of the first platy body. The support piece is disposed in the hole. The support piece has at least one fold line. The support piece is bendable relative to the first platy body. One end of the support piece is connected to the support portion. In this embodiment, a portion of one side of the first platy body is connected to the back of the mobile device and computer device, and the other portion is bendable relative to the mobile device and computer device. The other technical features are the same as the first embodiment or the second embodiment of the present invention.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. A mobile device and computer device stand for a mobile device/computer device, comprising:
    a first platy body, a middle portion of the first platy body being formed with a hole, a support portion being disposed on the first platy body, the support portion being located at one end of the first platy body; and
    a support piece, disposed in the hole, the support piece having at least one fold line so that the support piece is bendable relative to the first platy body, one end of the support piece being connected to the support portion;
    wherein, the mobile device and computer device stand further comprises a second platy body, one side of the second platy body is connected to a back of the mobile device/computer device; one end of one side of the first platy body is connected to one end of another side of the second platy body, the first platy body is bendable relative to the second platy body, the support portion is located at one end opposite to the end connected to the second platy body; and
    wherein the support piece has a first fold line and a second fold line, the support piece is divided into a first portion, a second portion, and a third portion by the first fold line and the second fold line, and the third portion is connected to the support portion.

2. The mobile device and computer device stand as claimed in claim 1, wherein the second portion is connected to the support portion.

3. The mobile device and computer device stand as claimed in claim 2, wherein when the first platy body and the support piece are in a bent state, the first portion passes through the hole to form an intersecting state with the first platy body, when the second portion and the support portion are placed on a plane, the mobile device and computer device stands on the plane in an inclined manner.

4. The mobile device and computer device stand as claimed in claim 3, wherein a magnetic member is provided in each of the support portion and the second platy body.

5. The mobile device and computer device stand as claimed in claim 2, wherein when the first platy body and the support piece are in a bent state, the first portion passes through the hole to form an intersecting state with the first platy body, and the support portion leans against the first platy body, when the fold line of the support piece is placed against a plane, the mobile device and computer device stands on the plane in an inclined manner.

6. The mobile device and computer device stand as claimed in claim 5, wherein the first platy body and the second platy body are made of a flexible material.

7. The mobile device and computer device stand as claimed in claim 5, wherein the support piece is integrally formed with the first platy body.

8. The mobile device and computer device stand as claimed in claim 2, wherein a magnetic member is provided in each of the support portion and the second platy body.

9. The mobile device and computer device stand as claimed in claim 1, wherein when the first platy body and the support piece are in a bent state, the first portion, the second portion or the third portion passes through the hole to form at least one intersecting state with the first platy body, when the third portion and the support portion are placed on a plane, the mobile device and computer device stands on the plane in an inclined manner.

10. The mobile device and computer device stand as claimed in claim 1, wherein when the first platy body and the support piece are in a bent state, the first fold line leans against the support portion.

11. The mobile device and computer device stand as claimed in claim 1, wherein a magnetic member is provided in each of the support portion and the second platy body.

* * * * *